United States Patent
Yang

[19]

[11] Patent Number: 6,098,027
[45] Date of Patent: Aug. 1, 2000

[54] CHARGE MODE OPEN/SHORT TEST CIRCUIT

[75] Inventor: Steven J. R. Yang, Hsinchu Hsien, Taiwan

[73] Assignee: Industrial Technology Research Institute, Hsinchu, Taiwan

[21] Appl. No.: 09/109,648

[22] Filed: Jul. 2, 1998

[51] Int. Cl.[7] .................................................. G01R 31/02
[52] U.S. Cl. ..................... 702/118; 702/108; 702/117; 324/519; 324/537; 324/754
[58] Field of Search ........................ 702/108, 117, 702/118, 125; 324/519, 754, 765, 537; 341/144, 155

[56] References Cited

U.S. PATENT DOCUMENTS

| | | | |
|---|---|---|---|
| 4,583,042 | 4/1986 | Riemer | 324/519 |
| 4,734,651 | 3/1988 | Keller et al. | 324/519 |
| 5,744,964 | 4/1998 | Sudo et al. | 324/537 |

*Primary Examiner*—Marc S. Hoff
*Assistant Examiner*—Hien Vo

[57] ABSTRACT

A charge mode open/short test circuit comprises at least two charge capacitors. A plurality of signal traces under test are connected to the test circuit first through a plurality of test tips on a test prober and then a plurality of transmission gates in a test circuit. In a load mode, reference data are loaded. In a test mode, a charge capacitor is sequentially selected and discharged into the parasitic capacitor corresponding to a sequentially selected signal trace under test for generating a charge balance signal. The signal is amplified and compared with the loaded reference data in either a digital or an analog manner. The compared pass/fail output related to the property of the signal trace is stored in a memory. In a following read mode, the stored pass/fail output is read out to an external unit for further processing.

13 Claims, 14 Drawing Sheets

CHARGE MODE OPEN/SHORT TEST CIRCUIT

FIELD OF INVENTION

The present invention relates to an open/short test circuit for testing parasitic capacitance of signal traces on a high interconnection density substrate, and more specifically to a charge mode open/short test circuit that can be designed in a VLSI chip and formed or attached to a membrane prober for a wafer probing system.

BACKGROUND OF THE INVENTION

As integrated circuits (IC) becomes faster and more complex, the number of input/output (I/O) pads increases drastically. In order to accommodate the complexity, one approach is to reduce the size and spacing of pads as much as possible, and another approach is to make variation on pad format such as an area-array format which has been proposed for integrated circuits with large number of inputs and outputs. The area-array pad format has been widely accepted and it may replace the traditional periphery format in the future. The probing test of such kind of chips using conventional needle probe cards, however, is very difficult because of the area-array format as well as the reduction in pad size and spacing.

The traditional approach of using a conventional probe card to interface a chip introduces parasitic capacitance and inductance that make it impossible to test the chip at full speed. Therefore, chips that are functional but do not meet speed requirements are usually packaged and then scraped later. This has become a severe problem as the operational speed of circuit devices continues to increase. Scraping and reworking finished systems that do not meet speed requirements greatly increases manufacturing cost. Therefore, it has become essential to test circuit devices such as those used in multi-chip modules (MCMs) at full speed. Furthermore, the output drivers of an advanced circuit device are designed with a smaller size in anticipation of reduced parasitic effects between chips. Hence, they are less effective in driving the conventional probe card and the tester. An accurate sort of good chips at the wafer level can save significant packaging costs. In order to provide a better screening process at the wafer level, it is necessary to use probe cards that have higher resolutions and allow testing at higher speeds. The probe cards also have to place less loading to the output drivers of the device under test.

An electronic membrane prober (MP) is a membrane style probe card fabricated from a silicon wafer with typical integrated circuit and micromachining technologies. The MP is capable of providing a very large number of probe tips in any format (can be greater than 1000), including area-array prober pad format, and is designed to satisfy the requirements of high speed and high resolution wafer-level testing.

The membrane is a thin, free-handling and low stress layer of silicon, silicon dioxide, silicon carbide, silicon nitride or polyimide. FIG. 1 shows a conceptual design of the MP. The probe lines are aluminum and the probe tips are tungsten. The probe card is fabricated with conventional integrated circuit processing techniques that are well established. In addition, more functionality can be added to the prober because active test circuitry can also be placed on the MP.

The membrane film of an MP provides the mechanical support for the probe lines and tips as well as the alignment of the probe card to the wafer under test if the membrane film is transparent. A membrane probe card can provide a very large number of probe tips in any area-array format. If the test circuitry is formed on the MP, the close proximity of the test circuitry greatly improves the electrical performance of the probing test. As compared to the conventional needle probe card, it has the advantage of decreased transit time, reduced loading effect and less signal attenuation. Consequently, the MP can meet the wafer-level at-speed test requirements that are not achieved by the conventional epoxy needle prober.

As the name indicates, MCM in general refers to assemblies of large active devices on an interconnected (signal/power traces) structure and may contain relatively large systems or subsystems. For cost effective reason, the open/short (O/S) test of the signal traces on the MCM substrate should be completed before the electronic components are bonded on them. A conventional solution is to measure the parasitic capacitance of each signal line by maneuvering one or more needle-type probers above the substrate plane.

Mainly due to the slow mechanical motion, it takes many minutes to complete an O/S test for one MCM substrate. In addition to the drawback of long test time, the test speed and the accuracy may also be affected by the long test probes connected to an external instrument. For example, using an one-needle prober with an average test speed of 1 trace per second, it takes 2.3 hours to complete an O/S test for a 6" silicon wafer on which there are 12 MCM substrates each having 700 signal traces (test points). Therefore, there is a strong need for an alternative O/S test methodology to shorten the test time and improve the test accuracy.

SUMMARY OF THE INVENTION

This invention has been made to meet the need of a high throughput O/S test circuit. The primary object of the invention is to provide a high speed O/S test circuit. Another object is to provide an O/S test circuit that can be designed in an intrinsic area-array IC.

The invention follows the basic principle employed in testing open or short of an MCM substrate. By measuring the parasitic capacitance of each signal trace on the substrate, the O/S property of each signal trace can be determined based on a specified tolerance.

The O/S test circuit of this invention comprises at least two on-chip capacitors. In measuring the trace capacitance, at one time, only one of these four capacitors is sequentially selected and discharged into the sequentially selected signal trace. After charge-balance between the selected capacitor and the parasitic trace capacitor of the selected signal trace is achieved, the balanced voltage at a special on-chip trace will be differentially amplified and then digitally converted by an A/D converter, and finally stored into a memory device.

According to the present invention, the circuit has two operation modes, Test mode and Read mode. In the Test mode, each trace capacitance will be calculated by measuring, amplifying, and digitizing the balanced discharge voltage at the special on-chip signal trace. The digitized data will then be stored into on-chip memory. After measuring, the Read mode operation follows and the stored data are read out to a data processing unit which may either be on or external to the MP to analyze the test result.

The test circuit of this invention can be designed into a general VLSI chip but is preferred to be implemented as an intrinsic-area-array chip due to its high pin counts and low parasities. If a chip is designed in the latter form, it can be mounted using Flip-Chip Attachment technology (FCA) on an MP for more benefits. Moreover, it is also possible to

DETAILED DESCRIPTION OF THE PREFERRED EMBODIMENTS

Figure 1:
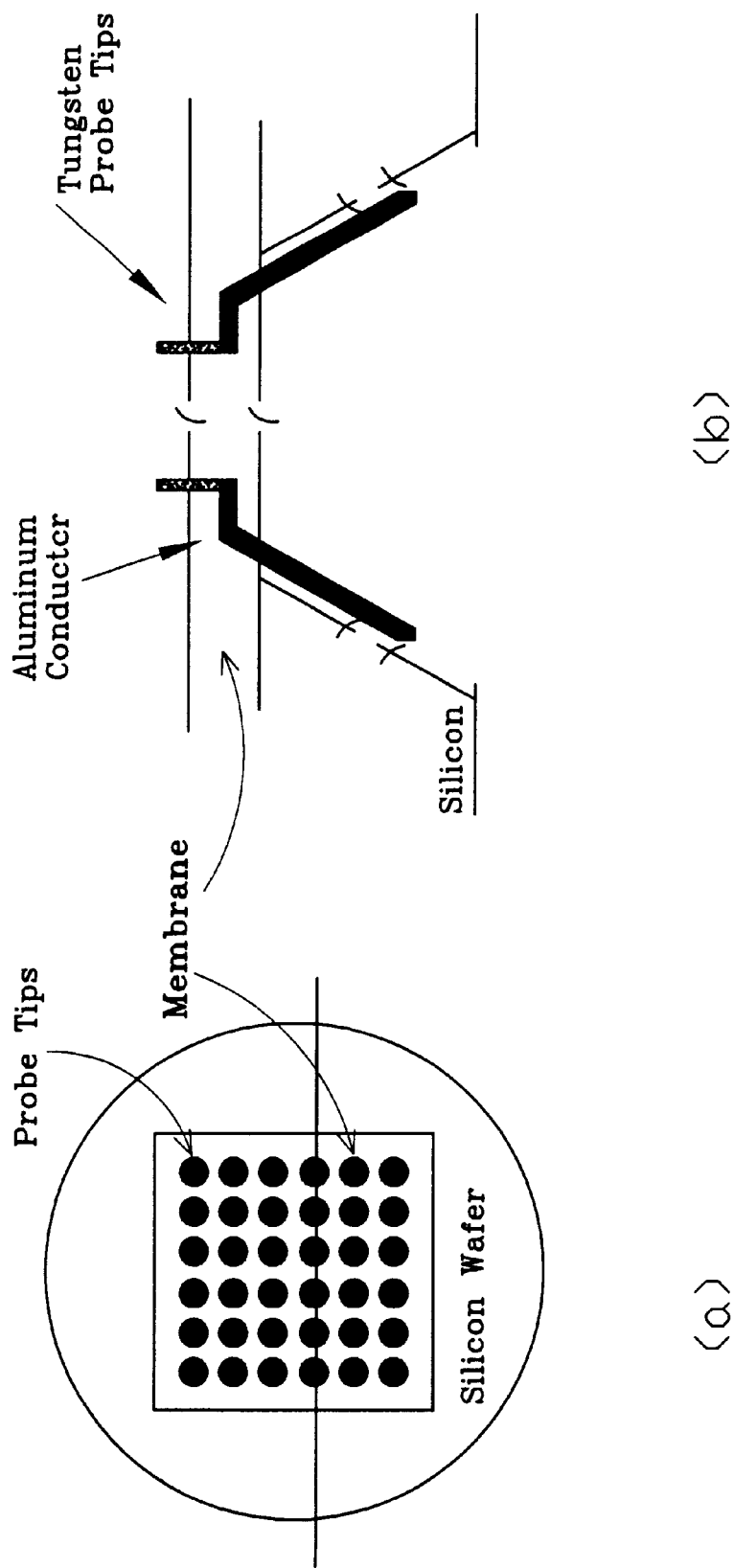
FIG. 1 illustrates top and cross-sectional views of a membrane array probe card.
Figure 2:
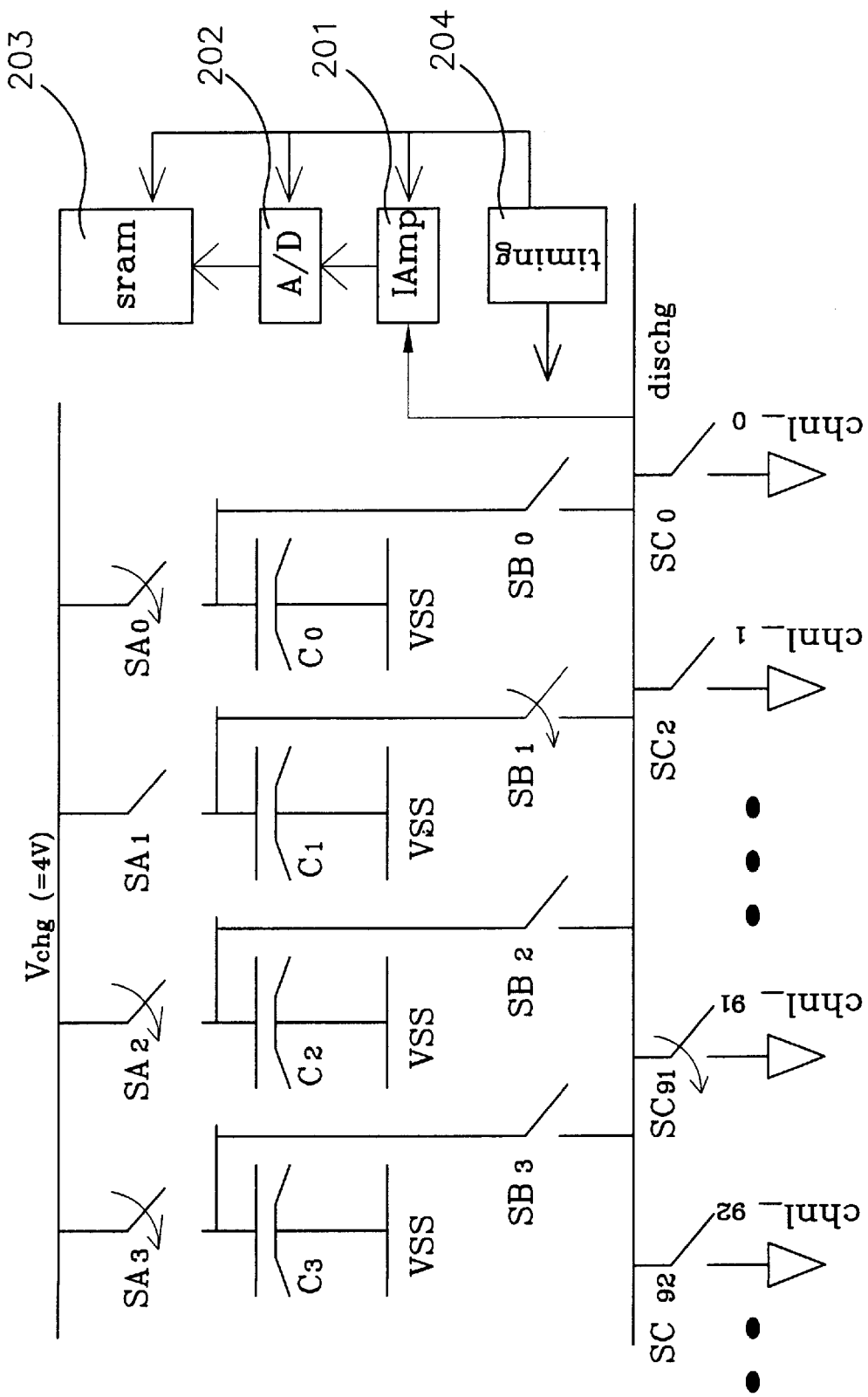
FIG. 2 shows the structure of the charge mode open/short test circuit of this invention.

The basic circuit structure of the O/S test circuit of this invention is shown in FIG. 2. The circuit has four capacitors $C_0$–$C_3$. Each capacitor has 10 pF capacitance. A plurality of signal traces chnl_0–chnl_N are under test. As shown in FIG. 2, at one time, switches $SA_0$–$SA_3$, $SB_0$–$SB_3$ and $SC_0$–$SC_N$ sequentially select one capacitor to discharge its electrical charge into a sequentially selected signal trace. In the example shown in the figure, the capacitor $C_1$ is selected for discharging into the signal trace chnl_91.

The circuit has two operation modes. One is Test Mode and the other is Read Mode. In the Test Mode, each trace capacitance is measured. As shown in the example of FIG. 2, after charge balance between the capacitor $C_1$ and the parasitic trace capacitor $C_{chnl\_91}$ of the signal trace chnl_91 is reached, the balanced voltage is sent through an on-chip trace dischg to an amplifier block IAmp 201. The voltage signal is differentially amplified and then digitized by an A/D block 202. The digitized signal is stored in a memory block sram 203. The timing block 204 provides all the required control signals for the operation of the circuit. In the Read Mode, the data stored in the memory block sram 203 are read into a signal processing subsystem (not shown in the figure) which is designed or mounted on an MP or is an unit external to the prober.

Figure 3:
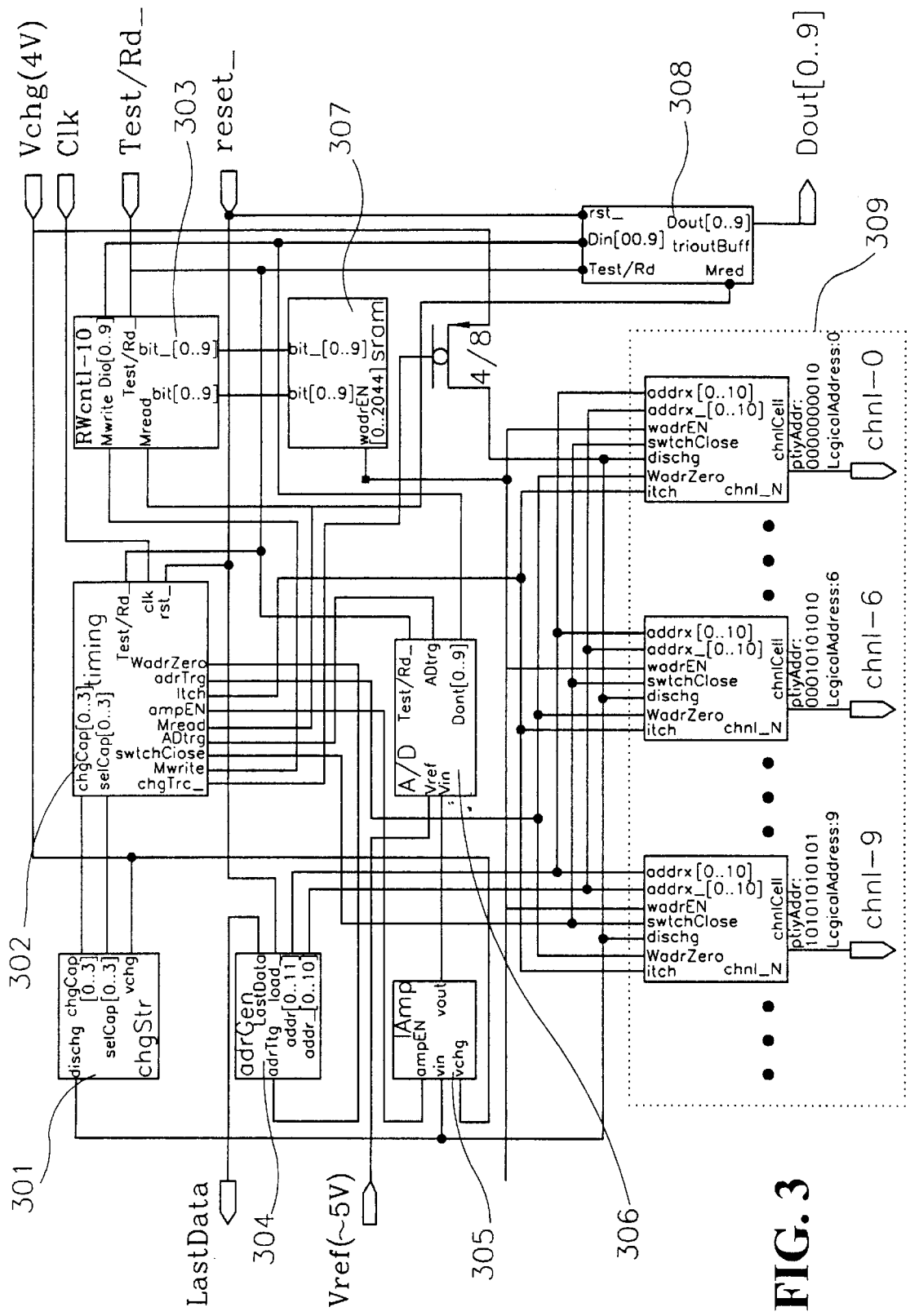
FIG. 3 shows the top-level functional block diagram of a first preferred embodiment of the charge mode open/short test circuit of the present invention.

FIG. 3 shows the top-level functional block diagram of a first preferred embodiment for the test circuit of the present invention. The test circuit comprises a chgstr block 301, a timing block 302, an RWcnt_10 block 303, an adrGen block 304, an IAmp block 305, an A/D block 306, an sram block 307, an triOutBuff block 308 and a plurality of chnlCell block 309. The I/O signals of the test circuit includes clk, Test/Rd_, reset_, Vchg, Dout[9 . . . 0], LastData and Vref.

The input signal clk is a clock input signal. Test/Rd_ is a mode switching signal. When Test/Rd_ is high, the Test mode is in operation, and the voltage associated with the capacitance of each signal trace on a high-density substrate under test is sequentially measured, digitized, and then stored into the sram block 307. When Test/Rd_ is low, the Read mode is in operation.

The input reset signal reset_ is a low active signal. When reset_ is active, the address generation block adrGen 304 is loaded with an initial state. A meaningful mode-switching operation is accompanied by an active reset_. In other words, after the reset operation is completed, the read or write operation follows depending on the state of the Test/Rd_ signal.

Vchg is a charging voltage for on-chip capacitors in the chgstr block 301. The preferred value in the example is 4 volts with 5 volts power. This voltage level is also used as a voltage reference for a differential op-amp used in the IAamp block 305. Dout[9 . . . 0] are 10-bits data output signals and can be read into a data processing subsystem (not shown in the figure) in the Read mode operation.

LastData is an output signal indicating that the last read/write data occurs and the read/write operation has been completed. When LastData is active, the data processing subsystem should either disable clk signal or enable reset_ signal before the memory address wraps around which may destroy the measured data. Vref is a voltage reference used in the A/D converter block 306. A voltage such as 5 volts can be used for Vref. In general, the preferred voltage is a little less than the full-rail voltage (VDD).

Among the function blocks of the O/S test circuit, blocks adrGen 304, IAmp 305, A/D 306, sram 307 and RWcntl_10 303 are general purpose function blocks commonly used in digital circuit design. They can readily be designed by a person skilled in the circuit design using either popular design techniques or techniques that are available in the public domain. They will only be briefly described in the following sections. The function blocks chgstr 301, timing 302 and chnlCell 309 are directly related to the charge balance principle used in the invention. They are designed specifically for the present invention and will be described in detail.

Figure 4:
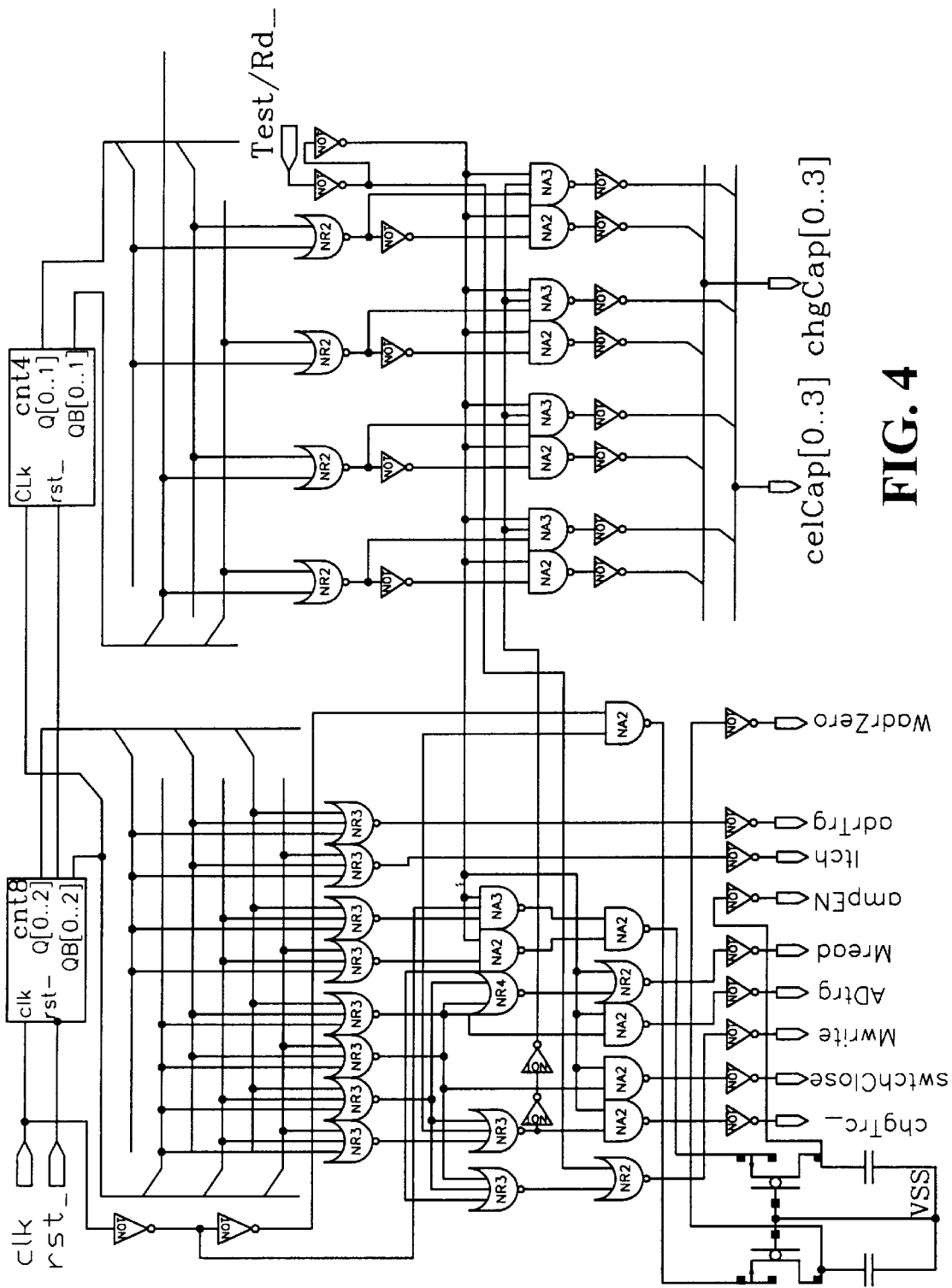
FIG. 4 shows the detailed circuit of the timing block of the preferred embodiment of FIG. 3.

The timing block 302 provides all the control signals for other function blocks. The control signals can be divided into two categories, one having a period four times that of the other. FIG. 4 shows a detailed circuit diagram for the timing block 302 of the preferred embodiment of the presention invention. Signals chgCap[3 . . . 0] and selCap[3 . . . 0] belong to the first category, while other signals belong to the second category. Two synchronous binary counters, cnt8 and cnt4, provide the basic timing signals for producing related control signals.

Figure 8:
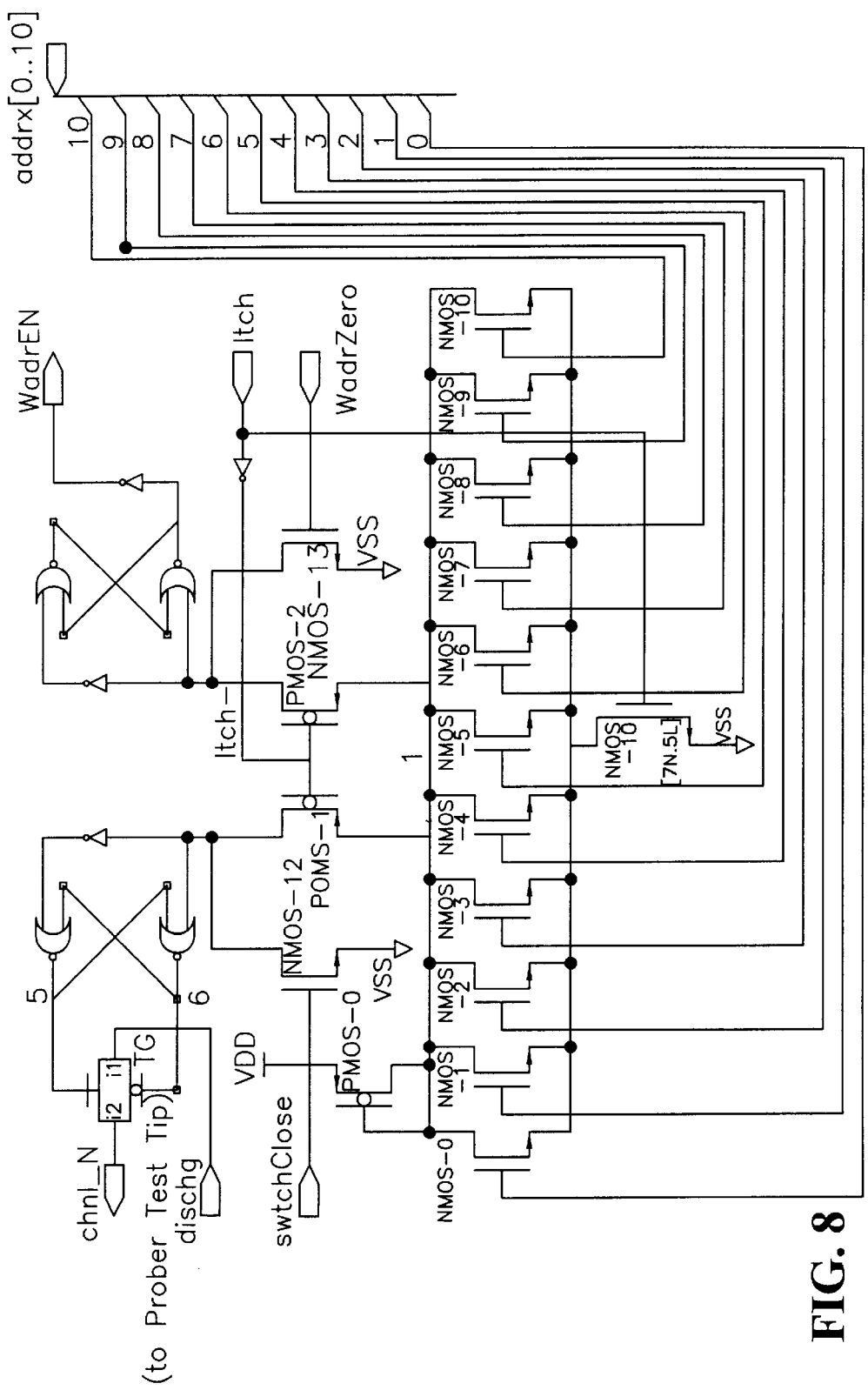
FIG. 8 shows the detailed circuit of a signal trace select block of the preferred embodiment of the present invention.

As shown in FIG. 4, there are several control output signals. WadrZero signal is a high active signal that is used to reset the Word-Line-Enable lines of memory blocks sram 307. The signal adrTrg is an address-generation trigger signal sent to the address generation block adrgen 304. The signal ltch is used to latch the address decoding output in each chnlCell block 309. As shown in FIG. 8, the latched output signal is related to the on/off state of a transmission gate TG as well as to the Word-Line-Enable signal WadrEN in the chnlCell block 309. The transmission gate TG serves as the switch $SC_n$, shown in FIG. 2.

For a low power design, the power for the amplifier block IAmp 305 will be disabled during an idle state. The control signal ampEN enables the amplifier during its high-level state. Mwrite signal is active in the Test mode. It controls the writing of the digitized data into the on-chip memory. Mread is active in the Read mode for reading out the measured data from the on-chip memory.

ADtrg signal triggers the operation of the A/D block 306. At the rising edge of this control signal, the A/D converter will be active; while at the falling edge, the converted output should be available. The converter is disabled during the period in which ADtrg is low for low power consideration. The signal swtchClose is a high active signal. Its function is similar to that of the control signal WadRZero but it is used to reset the transmission gate TG in each chnlCell block 309 of FIG. 8 to an off state. As mentioned earlier, TG is employed as a signal switch.

ChgTrc_ is a low active control signal. Because the on-chip signal trace, dischg, has a parasitic capacitor, after each measurement operation, the residual charge left at this capacitor may be different and the variation may affect the accuracy of the following measurement. To reduce this effect, the trace capacitor voltage will be charged to a fixed value such as 4 volts before the next measurement operation.

Figure 7:
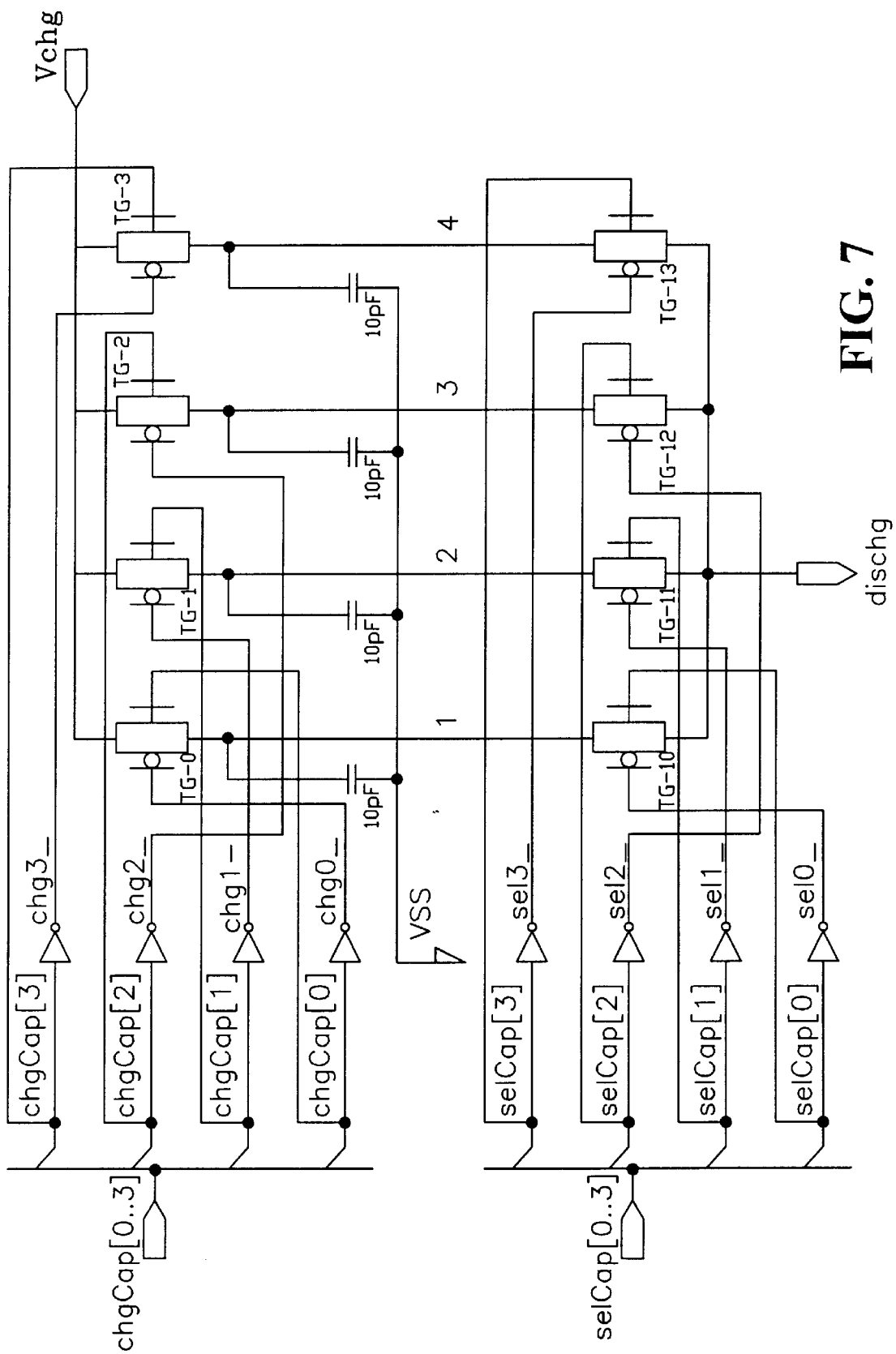
FIG. 7 shows a detailed circuit of the charge capacitor switching block of the preferred embodiment of the present invention.

The signals chgCap[3 . . . 0] are control signals for switches TG_0–TG_3 in chgStr block 301 as shown in FIG. 7. When the signal is at high level, the related switch is in an on state and the related on-chip capacitor will be fully charged to a voltage level, Vchg. At one instant, three capacitors are simultaneously in a charging state, and only one is open to the Vchg line. At the same time, it is this opened capacitor that discharges to the sequentially selected signal trace on the high-density substrate under test. The signal selCap[3 . . . ] are control signals for switches TG_10–TG_13 in chgstr block 301 as shown in FIG. 7. The two signals, selCap[n] and chgCap[n], are out-of-phase and non-overlapped with each other.

Figure 5:
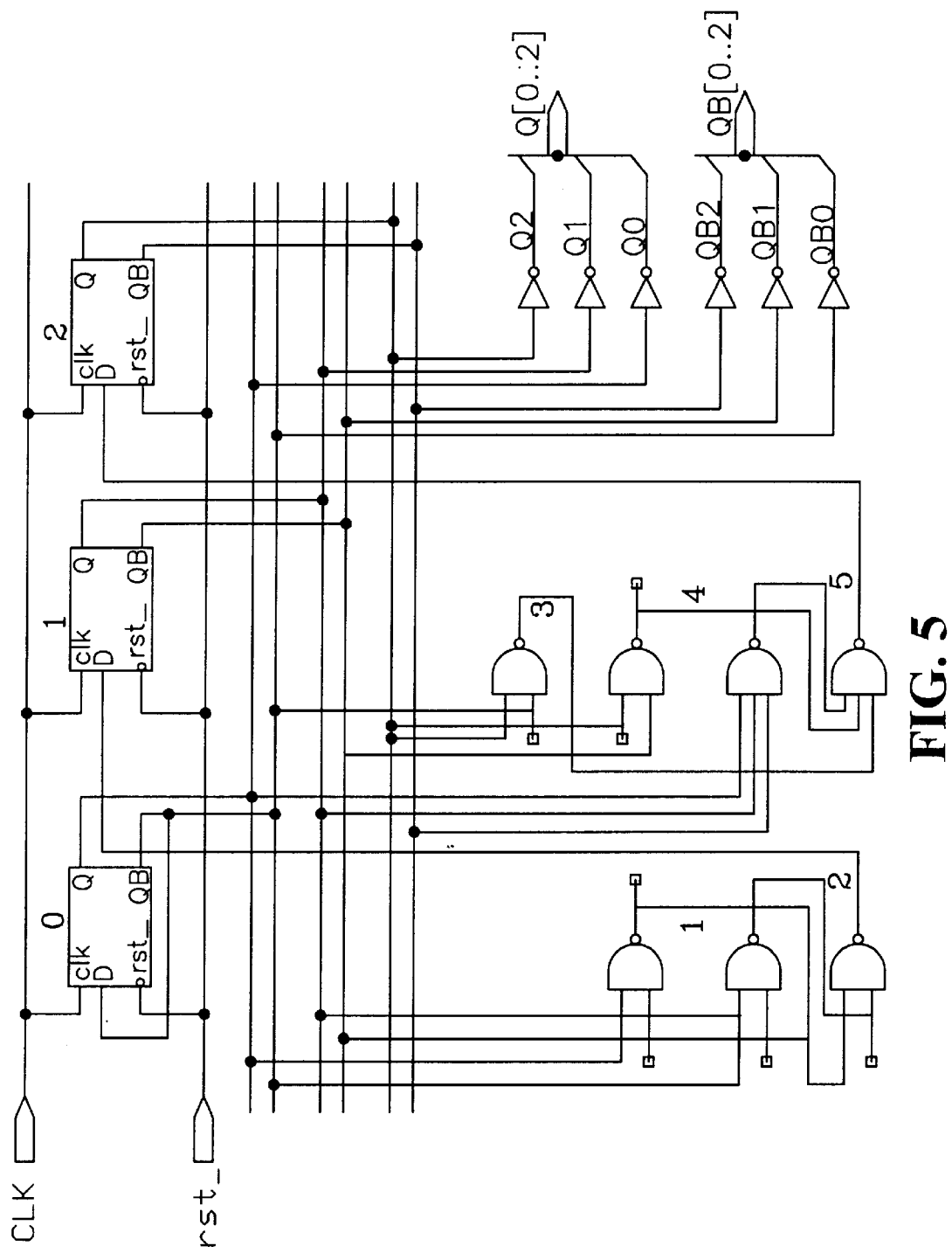
FIG. 5 shows the detailed circuit of a first synchronous counter of the timing block of the preferred embodiment of the present invention.
Figure 6:
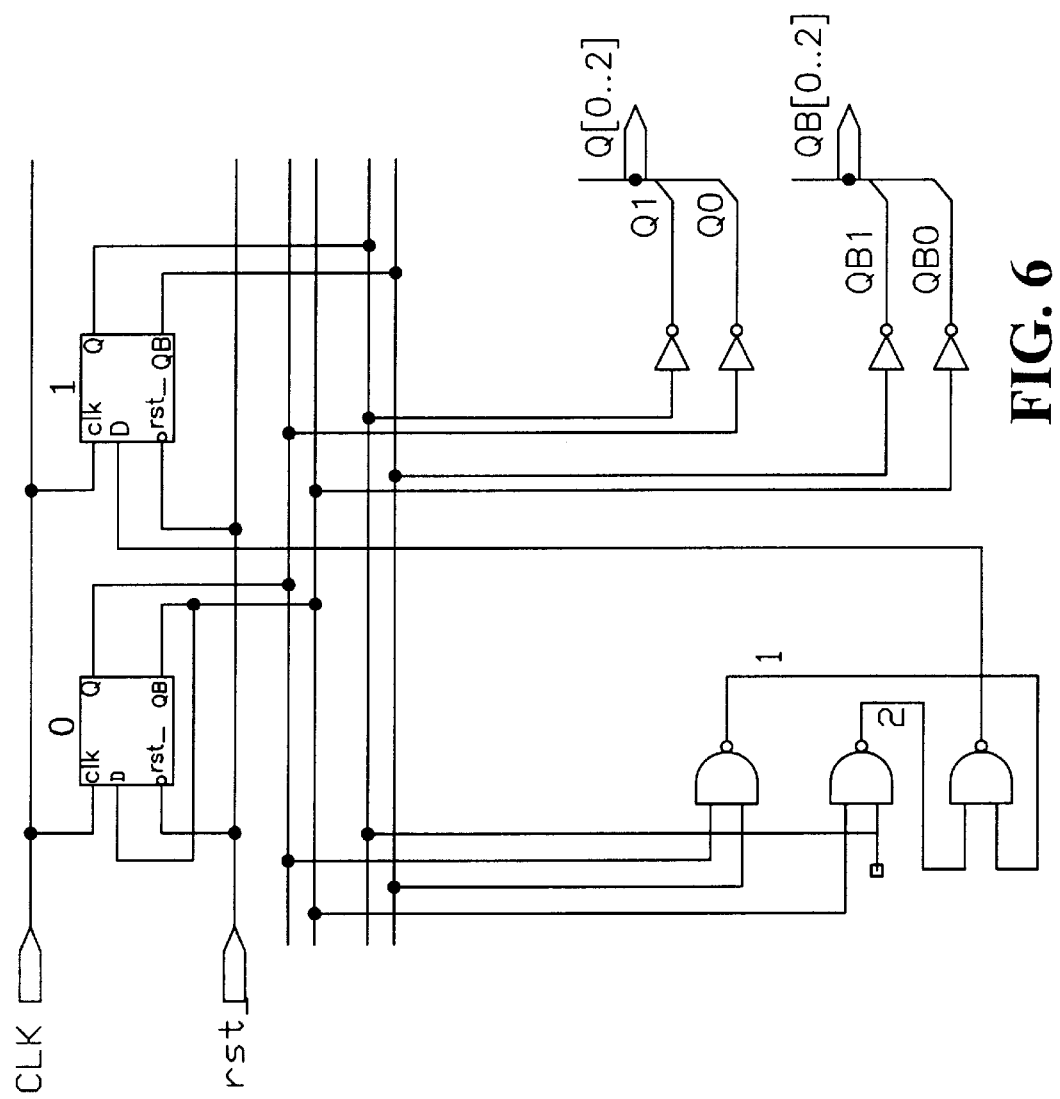
FIG. 6 shows the detailed circuit diagram of a second synchronous counter of the timing block of the preferred embodiment of the present invention.

The timing block as shown in FIG. 4 also includes two synchronous binary counters cnt8 and cnt4. FIGS. 5 and 6 show the detailed circuits for counters cnt8 and cnt4 respectively. The counter cnt8 is a synchronous binary counter with 8 states. When rst_ is low, the counter is reset to the <000> state. The counter cnt4 is a synchronous binary counter with 4 states. When rst_ is low, the counter is reset to the <00> state.

With reference to FIG. 7, the block chgstr 301 includes four capacitors, all with capacitance value 10 pF. Each capacitor has one pair of TGs directly attached. The on-off state of TGs in each pair is opposite to each other and the on-states of both do not overlap. This is one of the requirements for a good charging and discharging operation for each capacitor. The basic design principle for this block is that each capacitor should be fully charged to a saturation voltage level within an acceptable tolerance. While in a discharging state, the charge should be mainly in balance with the trace capacitor on the substrate under test, i.e., the charge leakage should also be kept within the tolerance.

The on-off control signals chgcap[n] and selCap[n] control the states of the transmission gates. Vchg is either used as a DC power source for charging on-chip capacitors i.e., $C_0–C_3$, or as a voltage reference for the amplifier block IAmp 305. Vchg can be supplied externally or from an on-chip voltage reference block. In designing the circuit, it is important that noise immunity is considered in supplying the voltage reference signal.

The signal dischg is the discharging path from the on-chip capacitor to the parasitic trace capacitor on the substrate under test. Starting from the block chgstr 301, this signal line will go to the input node of each transmitter gate TG of all the chnlCell 309 blocks as shown in FIG. 8. The TG, which acts as a signal switch, is turned on if the corresponding signal trace on the substrate is selected for measuring the parasitic capacitance.

Each chnlCell 309 as shown in FIG. 8 corresponds to one test tip/bump on the test side of an MP. There are two functions for this block. One is to generate the Word-Line-Enable signal WadrEN, which goes to the memory block sram 307, and the other is to generate the control signal 5/6 shown in FIG. 8 for the switch TG. Basically, both signal WadrEN and control signal 5/6 come from the same decoding output, i.e., signal 1, which is generated by decoding the address lines from adrgen block 304 at the falling edge of the control signal ltch. Both signals are reset to low states by the corresponding reset signals, WadrZero and swtClose, at different time. When the TG is turned on, the signal line dischg is electrically connected to the test tip/bump on the membrane of the MP.

Figure 9:
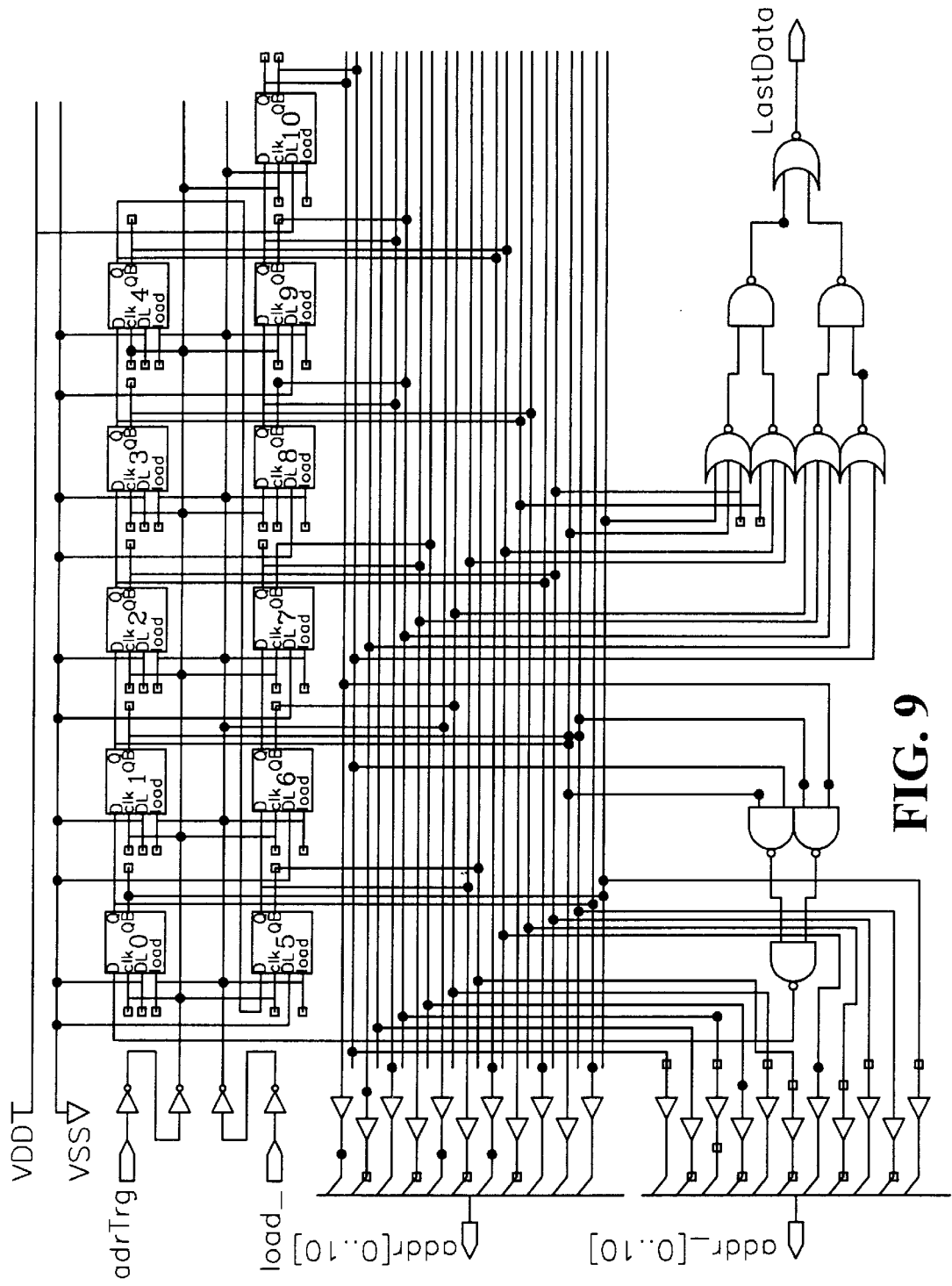
FIG. 9 shows the detailed circuit of the address generation block of the preferred embodiment of the present invention.

For testability and area-cost consideration, a pseudo random counter using maximum-length Linear Feedback Sift Registers is employed in the adrGen 304 block. With reference to FIG. 9, when the signal load_ is low, a randomly selected counter state which is hard-wired on chip in this example is loaded as an initial state <10000000000>. Then the counter counts in a pseudo random manner at the rising edge of signal adrTrg while load_ is held at high level. When another state (called the LastData state) is encountered, a high-level pulse appears at the output signal LastData to indicate that the associated read/write operation is completed. The LastData state <10101010101> in the example of FIG. 9 is also hard-wired into the chip for demonstration convenience but it can be designed to be software programmable by using shift registers and latches. Also for demonstration, $2^{11}-1$ is used as the length of the random counter states. But, in practice, the length depends on both the number of the signal traces (on the substrate under test) and an acceptable chip yield rate.

Figure 10:
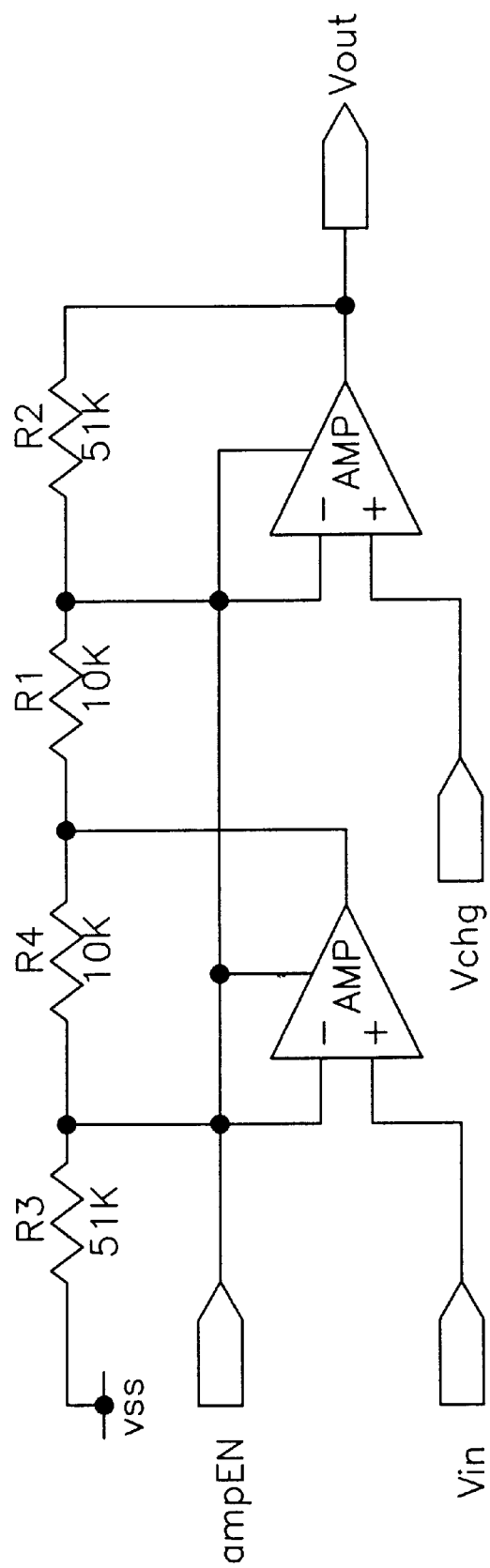
FIG. 10 shows an example of the amplifier block of the preferred embodiment of the present invention.

With reference to FIG. 10, the IAmp block 305 is an instrument amplifier, which amplifies the balanced discharge voltage at the dischg signal line. The purpose of amplifying this signal that has voltage range under 1 volt is to improve the digitizing resolution of the following A/D converter in the A/D 306 block. In a practical circuit, the gain of the amplifier which can be programmable depends on the parasitic capacitance range of the signal traces on the substrate under test, the dynamic output range of IAmp 305 as well as the dynamic input range of the A/D converter in the following stage.

The A/D block 306 comprises a 10-bits A/D converter which is active at the rising edge of the control signal ADtrg and produces digital outputs at the falling edge of the same control signal. The preferred conversion time is 1 µs which can be achieved using present design technique and general CMOS process. Because the balanced voltage at the on-chip signal line dischg can reach a stable state at the rising edge of ADtrg under the operation speed of 1 µs period clock signal (clk), the sample/hold block usually designed in an A/D converter may not be necessary. For a simpler design at the expense of more power consumption, the A/D converter can be designed to be active at any time. However, its related timing control signals should still be synchronized to the time interval in which ADtrg is high.

Figure 11:
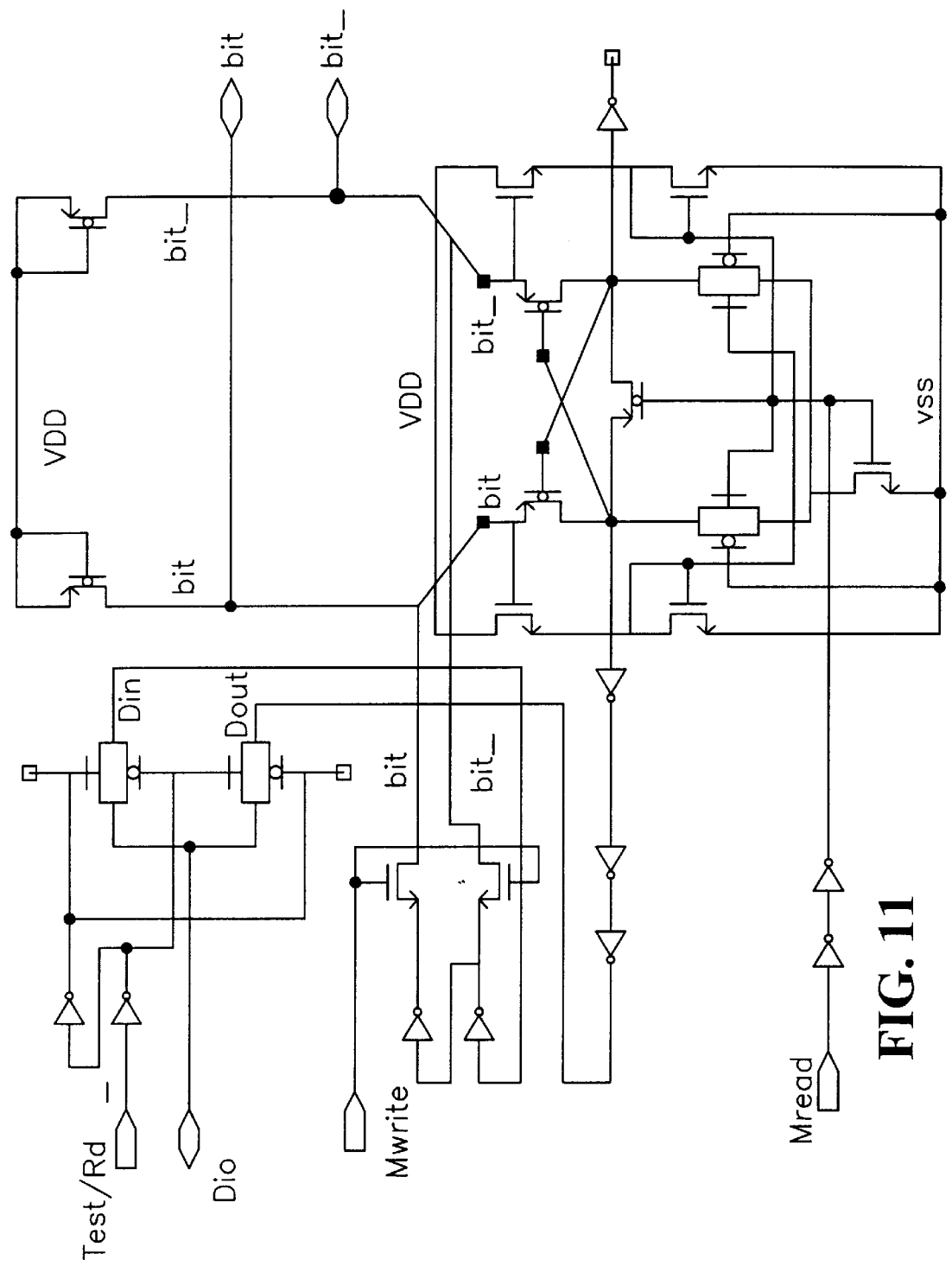
FIG. 11 shows the block diagram of the read/write control block of the preferred embodiment of the present invention.

The size of the static memory block sram 307 demonstrated in the design example is about 10*2k (bits*depth). From the present design aspect, the memory size is not too large so the related read/write control circuit design for the block RWcntl__10 303 is not a critical issue. The design specification can be easily met with popular design techniques. In a practical O/S test application, the memory depth corresponds to the I/O pins of the test chip which are to be connected to the test tips of an MP. Therefore, the memory size as used in the example is large enough from the viewpoint of an acceptable yield rate for chips with I/O counts around 1k. The block RWcntl__10 303 as shown in FIG. 11 comprises ten read/write control blocks as shown in FIG. 11 that read or write ten memory cells at each read or write operation.

Figure 12:
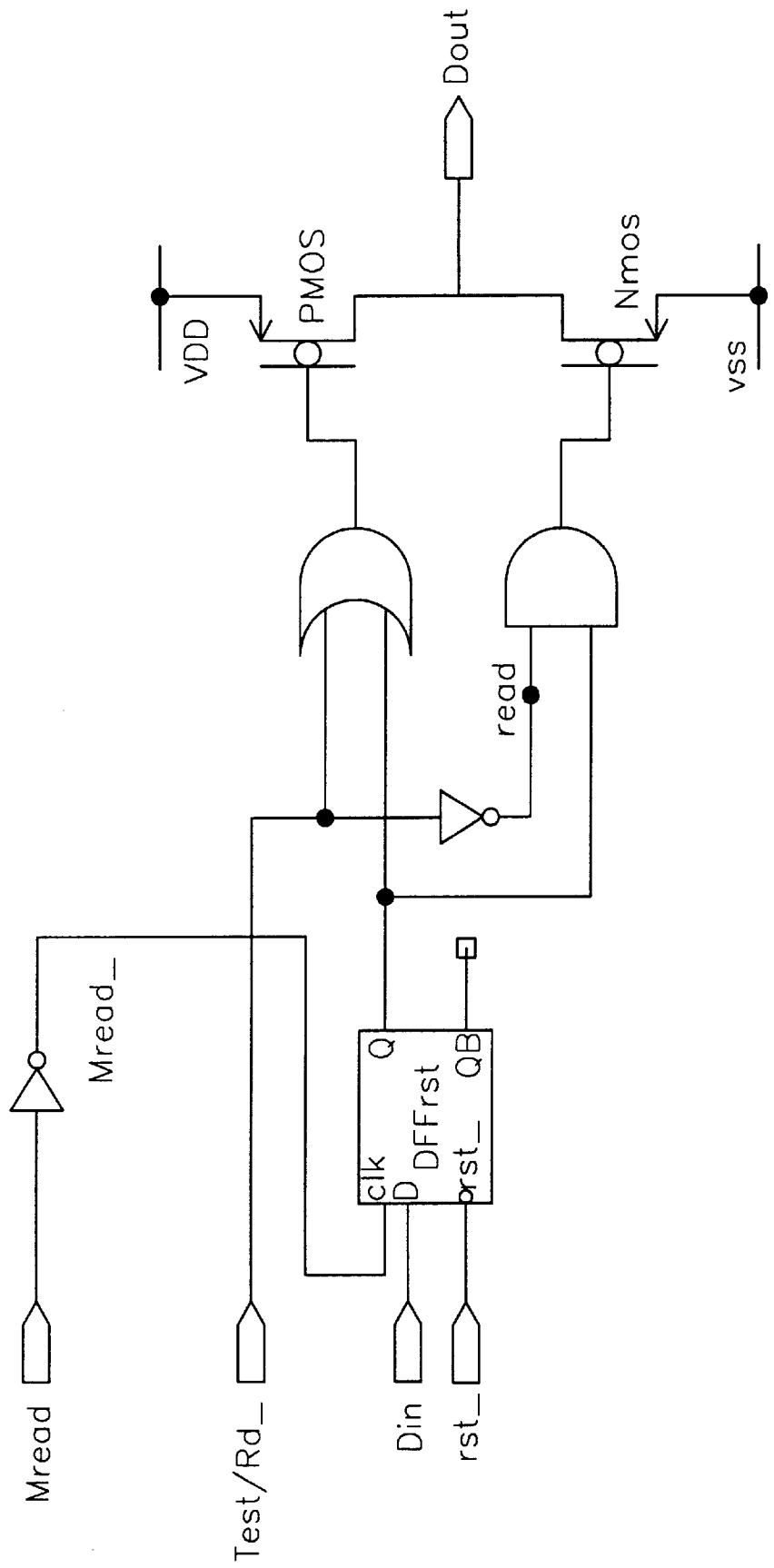
FIG. 12 shows an example of the output buffer block of the preferred embodiment of the present invention.

With reference to FIG. 12, the triOutBuff 308 block comprises ten tri-state output buffers. In the Test mode, each buffer output node has high impedance so that the chip interior is isolated from the outside world. While in the Read mode, the data are read out from the sram 307 block by the RWcntl__10 303 block to the internal data bus, and then latched to the output node Dout[9 . . . 0] at the falling edge of the control signal Mread.

As discussed earlier, the O/S test circuit of this invention can be designed into a general VLSI chip but due to high pin counts and low parasitics, it is preferred to be designed into a chip with intrinsic-area-array pads. If a chip is designed in the latter form, it can be mounted using Flip-Chip Attachment technology (FCA) on an MP for reducing transit time, loading effect and signal attenuation. Moreover, it is also possible to implement the test circuit in the same substrate along with the MP itself if a silicon substrate is available.

The O/S test circuit of this invention has very high throughput. In general, it takes test time in the order of seconds and does not need an expensive external impedance meters as required in a conventional test approach which takes test time in the order of hours.

As described for the first preferred embodiment, the digitized measured values related to the traces' capacitance are read out to an external signal processing unit for further making pass/fail decision. The computing efficiency can be raised at the expense of chip area if this decision making is placed inside the chip. This concept is practiced in a second preferred embodiment of this invention as shown in FIG. 13.

In the second embodiment, extra read-and-write memories are needed for storing both upper and lower tolerance limit data corresponding to substrate traces' capacitance. Each limit has 10-bit width. With each pair of upper and lower tolerance limits, a corresponding pass window can be constructed for making a pass/fail decision. Following the decision making, an 1-bit result indicating pass of fail is stored and finally read out to an external unit.

Figure 13:
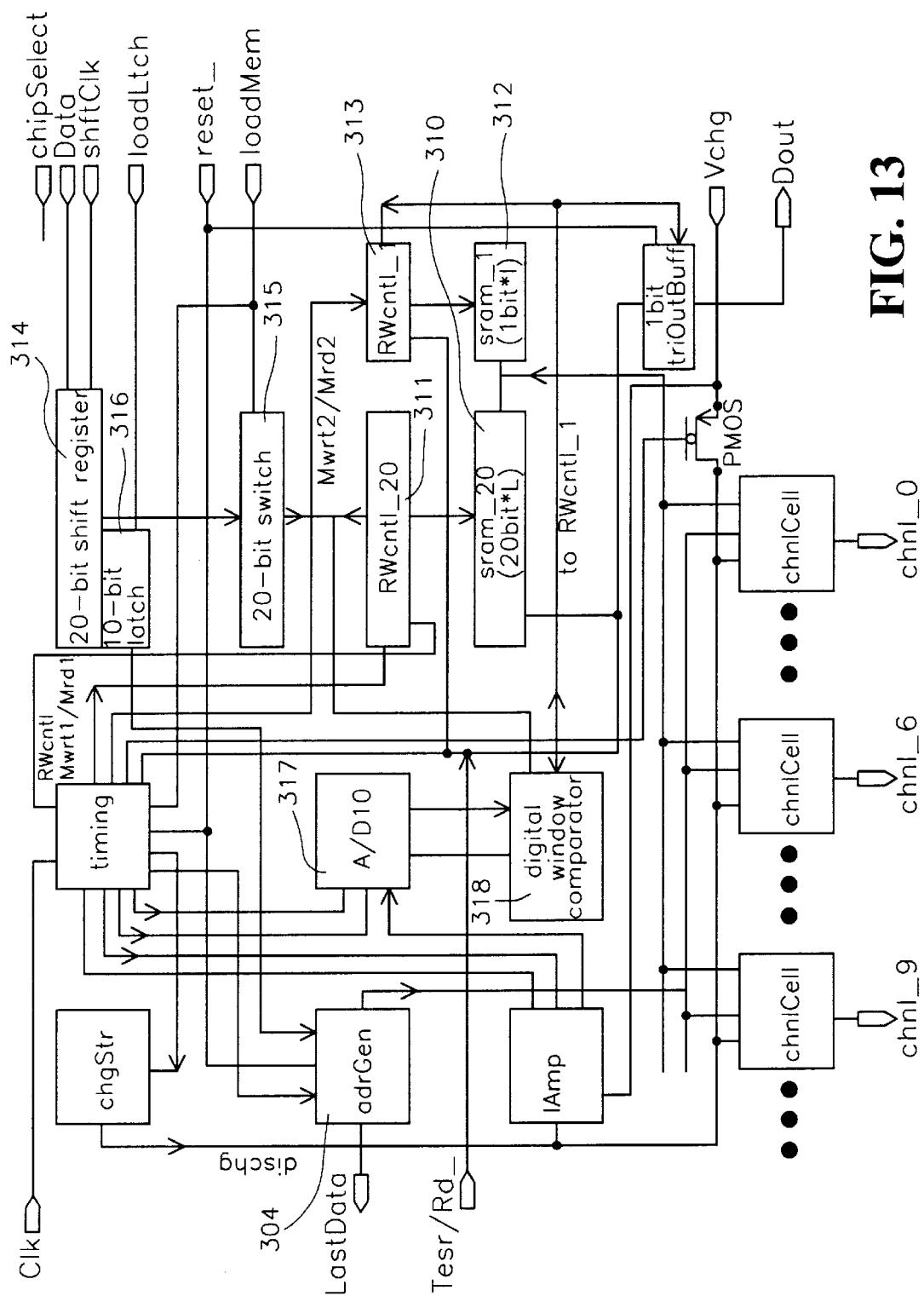
FIG. 13 shows the top-level functional block diagram of a second preferred embodiment of the charge mode open/short test circuit of the present invention.

In FIG. 13, the function blocks sram__20 310 and RWcntl__20 311 are the tolerance storage memory and the corresponding read/write control block respectively. The block sram__1 312 and RWcntl__1 313 are used for the 1-bit pass/fail data storage. Also, in FIG. 13, the function blocks 20-bit shift register 314 and 20-bit switch 315 are used to download the tolerance limits in a Load mode before starting the chip Test mode. With the 20-bit shift register 314 and a 10-bit latch 316, the lastData address vector, indicating the appropriate time for stopping the chip Test mode, can be programmed, shifted, and then latched into the adrgen 304 block. For illustration simplicity, this lastData vector is hard-wired into the adrGen 304 block in FIG. 3 as described above.

By using either a digital or an analog method in the pass/fail decision making, the corresponding building circuits can have two options. One option with a digital method as used in the second preferred embodiment contains one A-to-D converter A/D10 317 and one digital comparator digital-window comparator 318.

Figure 14:
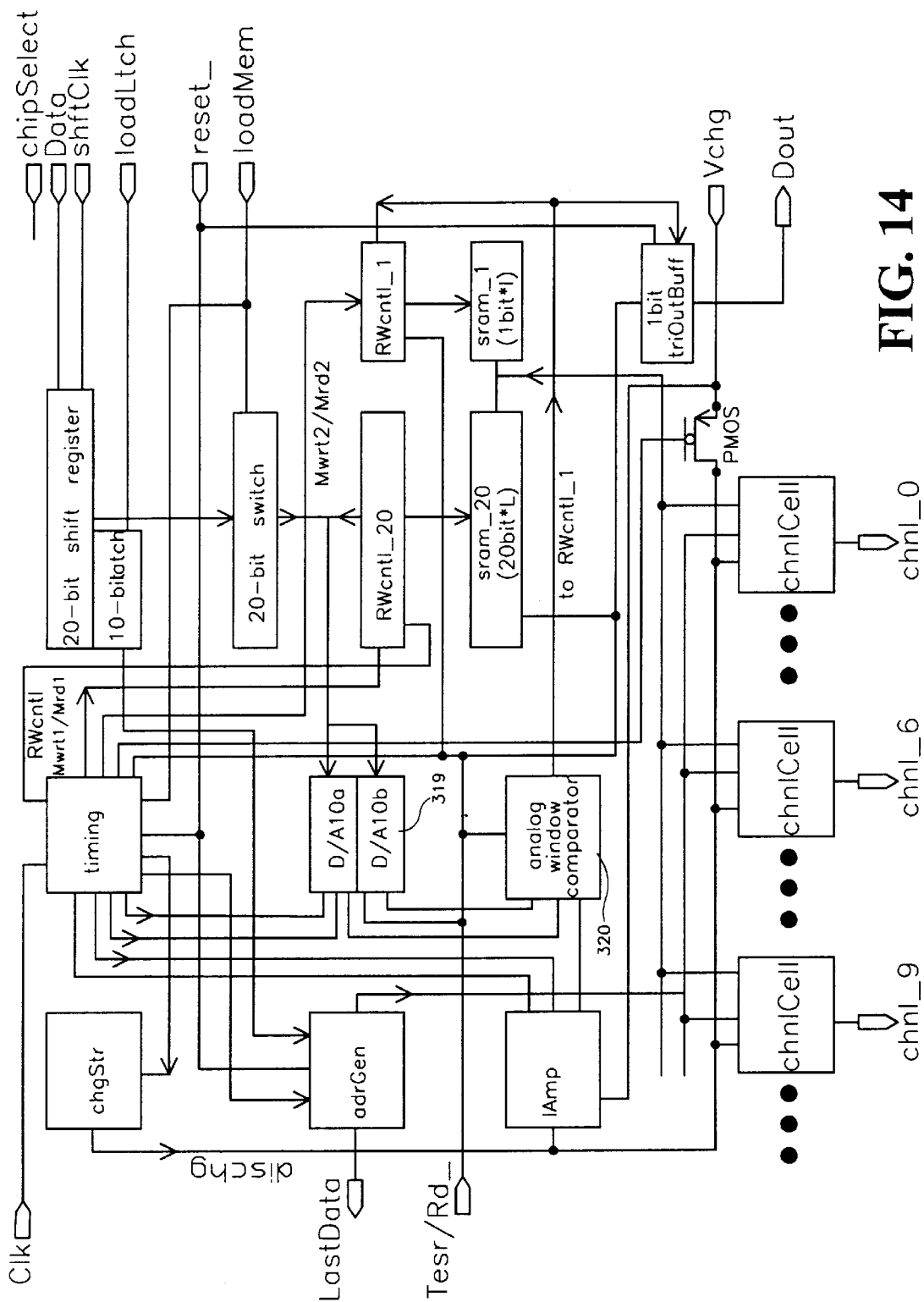
FIG. 14 shows the top-level functional block diagram of a third preferred embodiment of the charge mode open/short test circuit of the present invention.

FIG. 14 shows a third preferred embodiment of this invention in which an analog method for pass/fail decision making is used. It contains two D-to-A converters D/A10a and D/A10b 319 and one analog comparator analog-window-comparator 320. The two D-to-A converters can be reduced to one at the expense of longer timing latency.

Because the basic test flow for the second or third embodiment is the same as that of the first embodiment, a detailed timing description will not be given here. Their operation procedures are described in the following:

a. Set chipSelect to high for enabling the test chips. The circuit related to chipSelect is well known in the field.

b. Reset the test chip (set reset__ to low) and shift/latch the lastData address vector into adrgen block 304 by using control signals shftClk (shifting control clock), Data (serial data input), and loadLtch (latching control).

c. Set both reset__ and loadMem to high. Then shift the upper/lower tolerance limits' bits (20 bits) and latch them onto the I/O data ports of the RWcntl__20 311 control block by using control signals shftClk, Data, loadMem. With a rising Clk pulse (provided outside the chip) and an accompanied writing pulse Mwrt1 (from timing block 302), these 20 bit tolerance data will be written/loaded into the sram__20 310 memory block. By repeating the same download process, all tolerance limits can be sequentially loaded into the memory block sram__20 310.

d. In Test mode, set reset__ to high, Test/Rd__ to high and loadMem to low. In this mode, the on-chip capacitors will be sequentially charged and discharged into the selected trace parasitic capacitors till charge is balanced. Then, the balanced voltage is differentially amplified by IAmp block 305 and compared with corresponding tolerance limits either digitally or in an analog form. In the digital case as shown in FIG. 13, the IAmp 305 output should be digitized by the A-to-D converter A/D10 317 and compared using the digital comparator 318. In an analog case as shown in FIG. 14, it is passed directly to an analog comparator 320 for comparison. In each comparison, the corresponding tolerance limits are read out (20 bit per reading) and the compared output (1 bit) is stored/written into the memory block sram__1 312 which are to be read out to an external unit in the following Read mode. As for the Test mode, all embodiments have the same basic balanced-voltage measurement flow. The key difference is that the second and third embodiments have the extra on-chip digital or analog comparison function and the accompanied read-out operation for upper/lower tolerance limits' data as compared to the first embodiment.

e. In Read mode, set__ reset to high, Test/Rd__ to low and LoadMem to low. In this mode, the on-chip pass/fail test data stored in sram__1 block 312 are read out to an external unit. Although the same operation process is used for the second or third embodiment as for the first embodiment, the data width is different. In the second and third embodiment, the test data has only 1 bit per reading while the first embodiment has 10-bit data.

Finally, in the proposed open/short test methodology, it is essential to point out that, by using the charge balance principle, the test target should be charge-neutralized before the normal test operation. This can be done either by using charge neutralizer or, in a more economic and preferred way, by implementing it on the VLSI test chip. In the latter method, we do it by sequentially grounding the parasitic capacitor associated to the target-trace, and can be easily added in the chip initialization phase, which, for simplicity, is not illustrated in the above preferred embodiments.

What is claimed is:

1. A charge mode open/short test circuit for testing a plurality of signal traces, comprising:

a charge capacitor switching block having a plurality of charge capacitors, each of said charge capacitors being connected through a first switching device to a charging voltage and through a second switching device to a discharge signal line for outputting a balanced discharge signal;

an amplifier block receiving and amplifying said balanced discharge signal from said discharge signal line and generating an amplified signal;

an analog-to-digital conversion block receiving and digitizing said amplified signal into a digital signal;

a memory block for storing said digital signal; and a timing control block for generating control signals for said test circuit;

wherein each of said plurality of signal traces under test is connected through a third switching device to said discharge signal line.

2. The charge mode open/short test circuit according to claim 1, said test circuit having a test mode and a read mode, wherein in said test mode a charge capacitor is sequentially selected and discharged into a sequentially selected signal trace under test for generating a balanced discharge signal which is amplified, digitized and stored into said memory block for the selected signal trace, and in said read mode the stored signal in said memory block is read out to a signal processing unit.

3. The charge mode open/short test circuit according to claim 1, said charge capacitor switching block comprising at least two charge capacitors.

4. The charge mode open/short test circuit according to claim 1, said timing control block further comprising:

a first synchronous binary counter for generating first and second groups of switching control signals, said first and second groups of switching control signals controlling said first and second switching devices of said charge capacitor switching block respectively; and a second synchronous binary counter for generating a plurality of control signals.

5. The charge mode open/short test circuit according to claim 1, said test circuit is formed on an integrated circuit device substrate.

6. The charge mode open/short test circuit according to claim 1, said test circuit is formed in a multi-chip-module.

7. The charge mode open/short test circuit according to claim 1, said test circuit is formed on a membrane prober.

8. A charge mode open/short test circuit for testing a plurality of signal traces, comprising:

a charge capacitor switching block having a plurality of charge capacitors, each of said charge capacitors being connected through a first switching device to a charging voltage and through a second switching device to a discharge signal line for outputting a balanced discharge signal;

an amplifier block receiving and amplifying said balanced discharge signal from said discharge signal line and generating an amplified signal;

an analog-to-digital conversion block receiving and digitizing said amplified signal into a test digital signal;

a serially loading block for downloading digital tolerance limit signals and a last data address vector, said last data address vector indicating appropriate time for stopping a test;

a first memory block for storing said digital tolerance limit signals;

a second memory block for storing said last data address vector;

a digital comparator for comparing said test digital signal with said digital tolerance limit signals and sending out a 1-bit pass/fail signal;

a third memory block for storing said pass/fail signal; and a timing control block for generating control signals for said test circuit;

wherein each of said plurality of signal traces under test is connected through a third switching device to said discharge signal line.

9. The charge mode open/short test circuit according to claim 8, said test circuit having a load mode, a test mode and a read mode, wherein in said load mode said digital tolerance limit signals and said last data address vector are loaded into said first and second memory blocks respectively, in said test mode a charge capacitor is sequentially selected and discharged into a sequentially selected signal trace under test for generating a balanced discharge signal which is amplified, digitized and digitally compared with said digital tolerance limit signals for sending out said pass/fail signal, and in said read mode the stored pass/fail signal in said third memory block is read out to an external unit.

10. The charge mode open/short test circuit according to claim 8, said test circuit is formed on an integrated circuit device substrate, in a multichip-module, or on a membrane prober.

11. A charge mode open/short test circuit for testing a plurality of signal traces, comprising:

a charge capacitor switching block having a plurality of charge capacitors, each of said charge capacitors being connected through a first switching device to a charging voltage and through a second switching device to a discharge signal line for outputting a balanced discharge signal;

an amplifier block receiving and amplifying said balanced discharge signal from said discharge signal line and generating an amplified signal;

a serially loading block for downloading digital tolerance limit signals and a last data address vector, said last data address vector indicating appropriate time for stopping a test;

a first memory block for storing said digital tolerance limit signals;

a second memory block for storing said last data address vector;

a digital-to-analog conversion block receiving said digital tolerance limit signals from said first memory block and sending out corresponding analog tolerance limit signals;

an analog comparator for comparing said amplified signal with said analog tolerance limit signals and sending out a 1-bit pass/fail signal;

a third memory block for storing said pass/fail signal; and a timing control block for generating control signals for said test circuit;

wherein each of said plurality of signal traces under test is connected through a third switching device to said discharge signal line.

12. The charge mode open/short test circuit according to claim 11, said test circuit having a load mode, a test mode and a read mode, wherein in said load mode said digital tolerance limit signals and said last data address vector are loaded into said first and second memory blocks respectively, in said test mode a charge capacitor is sequentially selected and discharged into a sequentially selected signal trace under test for generating a balanced discharge signal which is amplified and compared with said analog tolerance limit signals for sending out said pass/fail signal, and in said read mode the stored pass/fail signal in said third memory block is read out to an external unit.

13. The charge mode open/short test circuit according to claim 11, said test circuit is formed on an integrated circuit device substrate, in a multi-chip-module, or on a membrane prober.

\* \* \* \* \*